United States Patent
Park et al.

(10) Patent No.: US 8,785,935 B2
(45) Date of Patent: *Jul. 22, 2014

(54) ETCHANT, DISPLAY DEVICE AND METHOD FOR MANUFACTURING DISPLAY DEVICE USING THE SAME

(75) Inventors: Hong-Sick Park, Suwon-si (KR); Wang-Woo Lee, Suwon-si (KR); Sang-Tae Kim, Iksan-si (KR); Joon-Woo Lee, Jeonju-si (KR); Young-Chul Park, Iksan-si (KR); Young-Jun Jin, Iksan-si (KR); Kyong-Min Kang, Iksan-si (KR); Young-Jin Yoon, Jeonju-si (KR); Suck-Jun Lee, Jeonju-si (KR); O-Byoung Kwon, Jeollabuk-do (KR); In-Ho Yu, Iksan-si (KR); Sang-Hoon Jang, Jeonju-si (KR); Min-Ki Lim, Iksan-si (KR); Dong-Ki Kim, Cheongju-si (KR)

(73) Assignee: Samsung Display Co., Ltd. (KR)

( * ) Notice: Subject to any disclaimer, the term of this patent is extended or adjusted under 35 U.S.C. 154(b) by 439 days.

This patent is subject to a terminal disclaimer.

(21) Appl. No.: 13/168,408

(22) Filed: Jun. 24, 2011

(65) Prior Publication Data
US 2012/0153287 A1 Jun. 21, 2012

(30) Foreign Application Priority Data

Dec. 15, 2010 (KR) ........................ 10-2010-0128314

(51) Int. Cl.
*H01L 29/04* (2006.01)
*H01L 27/12* (2006.01)

(52) U.S. Cl.
CPC .................................... *H01L 27/124* (2013.01)
USPC ............................................ 257/59; 252/79.3

(58) Field of Classification Search
CPC .............. H01L 27/124; H01L 27/1259; H01L 29/41733
USPC ............................................. 257/59; 252/79.3
See application file for complete search history.

(56) References Cited

U.S. PATENT DOCUMENTS

| 8,262,928 | B2 * | 9/2012 | Kim et al. | 252/79.3 |
| 8,354,288 | B2 * | 1/2013 | Kim et al. | 438/34 |
| 8,383,437 | B2 * | 2/2013 | Park et al. | 438/34 |
| 2008/0224092 | A1 * | 9/2008 | Choung et al. | 252/79.3 |
| 2012/0322187 | A1 * | 12/2012 | Choung et al. | 438/34 |

FOREIGN PATENT DOCUMENTS

| JP | 06330353 A | 11/1994 |
| JP | 2009076601 A | 4/2009 |
| KR | 100331888 B | 3/2002 |
| KR | 1020080084539 A | 9/2008 |

(Continued)

*Primary Examiner* — Ori Nadav
(74) *Attorney, Agent, or Firm* — Cantor Colburn LLP

(57) ABSTRACT

An etchant includes: 5 to 20 wt % of persulfate, 1 to 10 wt % of at least one compound of an inorganic acid, an inorganic acid salt, or a mixture thereof, 0.3 to 5 wt % of a cyclic amine compound, 1 to 10 wt % of at least one compound of an organic acid, an organic acid salt, or a mixture thereof, 0.1 to 5 wt % of p-toluenesulfonic acid, and water, based on the total weight of the etchant. A copper-titanium etchant further includes 0.01 to 2 wt % of a fluoride-containing compound. A method of forming a display device using the etchant, and a display device, are also disclosed.

9 Claims, 6 Drawing Sheets

(56) References Cited * cited by examiner

FOREIGN PATENT DOCUMENTS

| KR | 1020090014474 A | 2/2009 |
| KR | 1020090014750 A | 2/2009 |
| KR | 1020100064361 A | 6/2010 |

…

ETCHANT, DISPLAY DEVICE AND METHOD FOR MANUFACTURING DISPLAY DEVICE USING THE SAME

This application claims priority to Korean Patent Application No. 10-2010-0128314 filed on Dec. 15, 2010, and all the benefits accruing therefrom under 35 U.S.C. 119, the contents of which in their entirety are herein incorporated by reference.

BACKGROUND OF THE INVENTION (1) Field of the Invention

The present invention relates to an etchant, a display device using the same and a method for manufacturing the display device.

(2) Description of the Related Art

In general, thin film transistor ("TFT") array panels are used as a circuit board for independently driving each pixel in liquid crystal displays, organic electro luminescence ("EL") display devices, etc. The thin film transistor array panel has a scanning signal wire that transfers a scanning signal on a gate wire, and an image signal line that transfers an image signal on a data wire, and further includes a thin film transistor that is connected to the gate wire and the data wire, and a pixel electrode that is connected to the thin film transistor.

Upon manufacturing the thin film transistor array panel, metal layers for forming the gate wire and the data wire are stacked on a substrate and separated by insulating layers, followed by one or more processes of etching the metal layers to form the gate wire and data wire.

Copper having high electrical conductivity and a low resistance may be used for the gate wire and the data wire. Increasing the size of display devices also increases the thickness of the copper wiring, which in turn may cause a deterioration of profile in the thick copper wiring during the etching process.

The above information disclosed in this Background section is only for enhancement of understanding of the background of the invention and therefore it may contain information that does not form the prior art that is already known in this country to a person of ordinary skill in the art.

BRIEF SUMMARY OF THE INVENTION

In an embodiment, an etchant is provided, having an advantage of showing improved etching characteristics during an etching process to form thick copper wiring.

Also in an embodiment, a method is provided for manufacturing a display device using the etchant.

An exemplary embodiment provides an etchant including: 5 to 20 wt % of persulfate, 1 to 10 wt % of at least one compound of an inorganic acid, an inorganic acid salt or a mixture comprising at least one of the foregoing, 0.3 to 5 wt % of a cyclic amine compound, 1 to 10 wt % of at least one compound of an organic acid, an organic acid salt, or a mixture comprising at least one of the foregoing, 0.1 to 5 wt % of p-toluenesulfonic acid, and water, based on the total weight of the etchant.

The persulfate may include a compound selected from ammonium persulfate, sodium persulfate, potassium persulfate, or a combination comprising at least one of the foregoing.

The inorganic acid may include a compound selected from nitric acid, sulfuric acid, phosphoric acid, perchloric acid, or a combination comprising at least one of the foregoing, and the inorganic acid salt may include a compound selected from nitrate, sulfate, phosphate, perchlorate, or a combination comprising at least one of the foregoing.

The cyclic amine compound may include a compound selected from 5-aminotetrazole, tolyltriazole, benzotriazole, methyltriazole, or a combination comprising at least one of the foregoing.

The organic acid may include a compound selected from acetic acid, glycolic acid, citric acid, oxalic acid, or a combination comprising at least one of the foregoing, and the organic acid salt may include a compound selected from a potassium salt, a sodium salt, an ammonium salt, or a combination comprising at least one of the foregoing salts of a compound selected from acetic acid, glycolic acid, citric acid, oxalic acid, or a combination comprising at least one of the foregoing acids.

The etchant may further include a fluoride-containing compound of 0.01 to 2 wt % based on the total weight of the etchant.

The fluoride-containing compound may include a compound selected from ammonium fluoride, sodium fluoride, potassium fluoride, ammonium bifluoride, sodium bifluoride, potassium bifluoride, or a combination comprising at least one of the foregoing.

Another exemplary embodiment provides a method for manufacturing a display device, including: forming a gate metal layer that includes a lower gate metal layer on an insulation substrate, and an upper gate metal layer on the lower gate metal layer; etching the gate metal layer using a copper-titanium etchant to form a gate line including a gate electrode; forming a gate insulating layer on the gate line; sequentially forming a first amorphous silicon layer on the gate insulating layer, a second amorphous silicon layer on the first amorphous silicon layer, a lower data metal layer on the second amorphous layer, and an upper data metal layer on the lower data metal layer; etching the first amorphous silicon layer, the second amorphous silicon layer, the lower data metal layer and the top data metal layer to form a semiconductor layer, an ohmic contact layer, a data line including a source electrode and a drain electrode; forming a passivation layer on the data line, the drain electrode and the gate insulating layer; and forming a pixel electrode electrically connected to the drain electrode on the passivation layer, wherein the copper-titanium etchant comprises 5 to 20 wt % of persulfate, 1 to 10 wt % of at least one compound of an inorganic acid, an inorganic acid salt, or a mixture comprising at least one of the foregoing, 0.3 to 5 wt % of a cyclic amine compound, 1 to 10 wt % of at least one compound of an organic acid, an organic acid salt, or a mixture comprising at least one of the foregoing, 0.1 to 5 wt % of p-toluenesulfonic acid, 0.01 to 2 wt % of a fluoride-containing compound and water, based on the total weight of the etchant.

The lower gate metal layer and the lower data metal layer may be made of titanium or a titanium-containing metal, and the upper gate metal layer and the upper data metal layer may be made of copper or copper-containing metal.

The upper data metal layer and the lower data metal layer may be etched using the copper-titanium etchant at the same time.

In an alternative embodiment, the upper data metal layer may be etched using a copper etchant.

The copper etchant may comprise 5 to 20 wt % of persulfate, 1 to 10 wt % of at least one compound of an inorganic acid, an inorganic acid salt, or a mixture comprising at least one of the foregoing, 0.3 to 5 wt % of a cyclic amine compound, 1 to 10 wt % of at least one compound of an organic acid, an organic acid salt, or a mixture comprising at least one of the foregoing, 0.1 to 5 wt % of p-toluenesulfonic acid and water, based on the total weight of the etchant.

Yet another exemplary embodiment provides a display device including: an insulation substrate, a gate line disposed on the insulation substrate, a gate insulating layer disposed on the gate line, a semiconductor layer disposed on the gate line, a data line disposed on the semiconductor layer and including a source electrode electrically connected to the data line, a drain electrode disposed on the semiconductor layer on a same surface as and facing the source electrode, and a pixel electrode electrically connected to the drain electrode, wherein the gate line, the data line and the drain electrode each include a lower layer made of titanium or titanium-containing metal and an upper layer disposed on the lower layer and made of copper or copper-containing metal, respectively, and the upper layer has a thickness of 10,000 to 50,000 Å and a lateral side of the upper layer is inclined to the insulation substrate by an angle of 40 to 60 degrees.

According to exemplary embodiments, etching characteristics of a thick copper layer can be improved by using the copper-titanium etchant or the copper etchant.

DESCRIPTION OF SYMBOLS IN THE FIGURES

Figure 1:
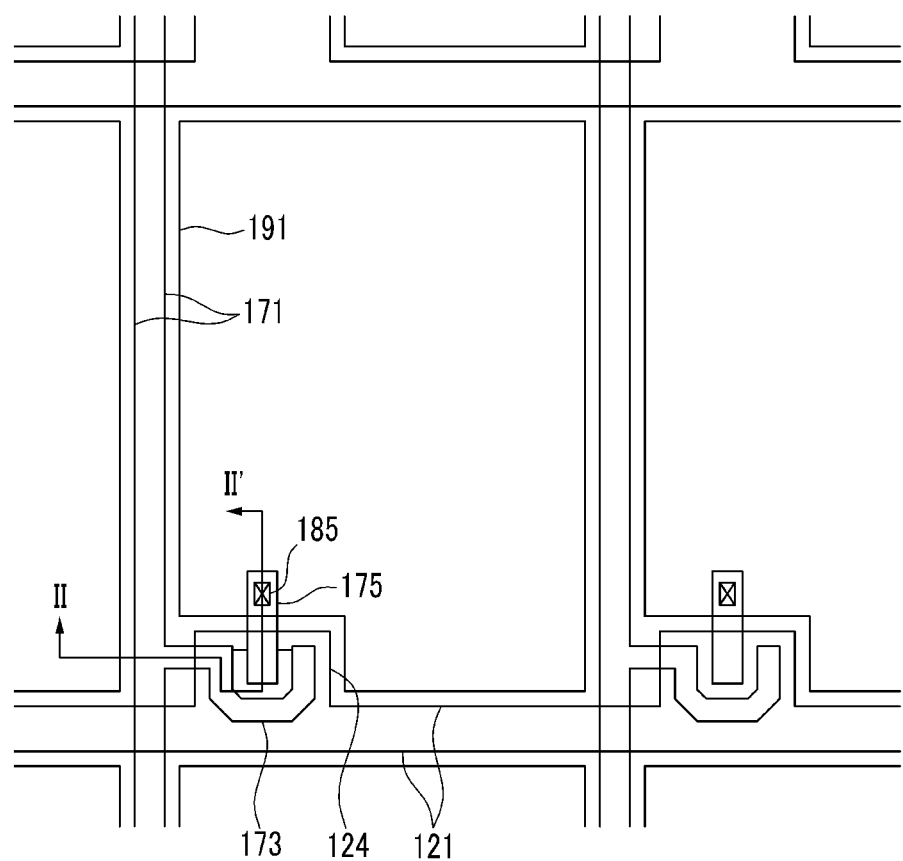
FIG. 1 is a layout view of a thin film transistor array panel according to an exemplary embodiment.

| | |
|---|---|
| 110: Substrate | 121: Gate line |
| 154: Semiconductor layer | 171: Data line |
| 173: Source electrode | 175: Drain electrode |

DETAILED DESCRIPTION OF THE INVENTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, regions, integers, steps, operations, elements, and/or components, but do not preclude the presence or addition of one or more other features, regions, integers, steps, operations, elements, components, and/or groups thereof. All ranges and endpoints reciting the same feature are independently combinable.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, an etchant according to an exemplary embodiment will be described.

An etchant according to an exemplary embodiment includes a copper-titanium etchant capable of simultaneous, sequential etching of a double layer (e.g., of a copper layer and a titanium layer simultaneously, or a copper layer followed by a titanium layer later in the same etch process), and a copper etchant capable of selectively etching copper (Cu) or a copper-containing metal layer, in which the etchant is used for etching a metal wiring of a double layer having a titanium (Ti) or titanium-containing metal layer and a copper (Cu) or copper-containing metal layer formed on the titanium (Ti) or titanium-containing metal layer.

Copper-Titanium Etchant

First, the copper-titanium etchant will be described in detail.

The copper-titanium etchant according to the exemplary embodiment includes persulfate; a fluoride-containing compound; at least one compound of an inorganic acid, an inorganic acid salt, or a mixture comprising at least one of the foregoing; a cyclic amine compound; at least one compound of an organic acid, an organic acid salt, or a mixture comprising at least one of the foregoing; p-toluenesulfonic acid; and water.

The persulfate is the primary oxidizing agent for etching the copper or copper-containing metal layer, and is included in an amount of 5 to 20 wt %, and preferably 7 to 18 wt %, based on the total weight of the copper-titanium etchant. The persulfate included in the copper-titanium etchant in this amount allows for the copper or copper-containing metal layer to be etched in an appropriate manner, and so that the etching profile is improved.

The persulfate may be selected from ammonium persulfate ("APS"), sodium persulfate ("SPS"), potassium persulfate ("PPS"), or a combination comprising at least one of the foregoing.

The fluoride-containing compound is a primary ingredient for etching the titanium or titanium-containing metal layer, and is included in an amount of 0.01 to 2 wt %, and preferably 0.05 to 1 wt %, based on the total weight of the copper-titanium etchant. The fluoride-containing compound included in the copper-titanium etchant in this amount allows for the titanium or titanium-containing metal layer to be etched in an appropriate manner, and so that the etching profile is improved.

If the content of the fluoride-containing compound is less than 0.01 wt %, the etching speed of the titanium or titanium-containing metal layer may deteriorate (e.g., by steadily slowing), leading to formation of etching residues. If the content of the fluoride-containing compound is more than 2 wt %, a substrate having copper or titanium copper on it, such as glass or a silicon-containing insulating layer, may be damaged.

The fluoride-containing compound is a compound that is able to dissociate into fluoride ion or polyatomic fluoride ion, and may be selected from ammonium fluoride, sodium fluoride, potassium fluoride, ammonium bifluoride, sodium bifluoride, potassium bifluoride, and a combination comprising at least one of the foregoing.

At least one compound of an inorganic acid, an inorganic acid salt, or a mixture comprising at least one of the foregoing oxidizes and etches the copper or copper-containing metal layer, and oxidizes the titanium or titanium-containing metal layer.

At least one compound of an inorganic acid, an inorganic acid salt, or a mixture comprising at least one of the foregoing is included in an amount of 1 to 10 wt %, and preferably 2 to 7 wt %, based on the total weight of the copper-titanium etchant.

At least one compound of an inorganic acid, an inorganic acid salt, or a mixture comprising at least one of the foregoing, included in the copper-titanium etchant in this amount allows the copper or copper-containing metal layer and the titanium or titanium-containing metal layer to be etched in an appropriate manner, and so that the etching profile is improved.

If the content of at least one compound of an inorganic acid, an inorganic acid salt, or a mixture comprising at least one of the foregoing is less than 1 wt %, the etching speed may deteriorate, generating etching profile defects and forming etching residues. If the content of at least one compound of an inorganic acid, an inorganic acid salt, a mixture comprising at least one of the foregoing is 10 wt % or more, over-etching may occur, which can in turn cause cracks in the photoresist pattern adjacent to and defining the area being etched; etchant which penetrates the cracks may short or otherwise damage the wiring formed by the etching.

The inorganic acid may be selected from nitric acid, sulfuric acid, phosphoric acid, perchloric acid, or a combination comprising at least one of the foregoing, and the inorganic acid salt may be selected from nitrate, sulfate, phosphate and perchlorate, or a combination comprising at least one of the foregoing anions. The inorganic acid salt may include as a cation an alkali metal cation including a lithium, sodium, or potassium cation; an ammonium cation, an alkaline earth metal cation including magnesium or calcium cation; or a combination comprising at least one of the foregoing cations.

The cyclic amine compound, included in the etchant, controls the formation of a profile upon etching the copper or copper-containing metal layer. The cyclic amine compound is included in an amount of 0.3 to 5 wt %, and preferably 0.5 to 3 wt %, based on the total weight of the copper-titanium etchant. The cyclic amine compound, included in the copper-titanium etchant in this amount allows for a suitable copper etching rate and formation of a suitable taper angle for the sidewall of the etched wiring, and the amount of lateral etching can be controlled.

The cyclic amine compound is a $C_{2-20}$ triazole and may be selected from 5-aminotetrazole, tolytriazole, benzotriazole, methyltriazole, or a combination comprising at least one of the foregoing.

At least one compound of an organic acid, an organic acid salt, or a mixture comprising at least one of the foregoing further controls the taper angle of copper or copper-containing metal layer and the etching speed of the copper or copper-containing metal layer, to maintain a predetermined etching profile for a desirable lateral etching.

At least one compound of an organic acid. an organic acid salt, or a mixture comprising at least one of the foregoing is included in an amount of 1 to 10 wt %, and preferably 2 to 7 wt %, based on the total weight of the copper-titanium etchant.

If the content of at least one compound of an organic acid, an organic acid salt, or a mixture comprising at least one of the foregoing is less than 1 wt %, it is difficult to consistently maintain a predetermined etching profile. If the content of at least one compound of an organic acid. an organic acid salt, a mixture comprising at least one of the foregoing is 10 wt % or more, over-etching may occur to increase the lateral etching.

The organic acid may be a $C_{1-20}$ carboxylic acid selected from acetic acid, glycolic acid, citric acid, oxalic acid, or a combination comprising at least one of the foregoing, and the organic acid salt may be selected from a potassium salt, a sodium salt, an ammonium salt or a combination comprising at least one of the foregoing of a compound selected from acetic acid, glycolic acid, citric acid, oxalic acid, or a combination comprising at least one of the foregoing.

The inclusion of p-toluenesulfonic acid in the etchant as a stabilizer prevents changes in the etching characteristics due to secular changes occurring in the composition after preparation of the copper-titanium etchant, and allows for long term storage of the copper-titanium etchant by improving shelf-life, relative to comparable but unstabilized etchant compositions.

The p-toluenesulfonic acid is included in an amount of 0.1 to 5 wt %, and preferably 0.5 to 3 wt %, based on the total weight of the copper-titanium etchant.

If the content of p-toluenesulfonic acid is less than 0.1 wt %, changes in the etchant due to secular changes (i.e., degradation of the composition and loss of efficacy upon standing) may occur. If the content of p-toluenesulfonic acid is equal to or more than 3 wt %, the secular changes can be prevented, but over-etching due to the accompanying increased acidity may cause deterioration of the profile of the wiring.

Water is deionized water, and water used in semiconductor processing is used, and water of 18 milliohm per centimeter (MΩ/cm) or lower is preferred. Water is included with the etchant components in the copper-titanium etchant to provide the compositional balance of 100 wt %, based on the total weight of the copper-titanium etchant.

In addition to the aforementioned etchant components, the copper-titanium etchant may further include at least one ingredient selected from an etching adjustment agent, a surfactant, a chelating agent, a corrosion inhibitor, or a combination comprising at least one of the foregoing, where it will be understood that inclusion of such further ingredients will displace a corresponding weight percentage of water.

The copper-titanium etchant effectively etches a double layer having the titanium or titanium-containing metal layer and the copper or copper-containing metal layer formed on the titanium or titanium-containing metal layer, to provide the metal wiring with desirable profile and low or no defectivity.

Hereinafter, performance of the copper-titanium etchant of will be described with reference to specific Experimental Examples.

EXAMPLE 1

As shown in Table 1, 180 kg of a copper-titanium etchant that contains 10 wt % of ammonium persulfate, 0.5 wt % of ammonium bifluoride, 3 wt % of nitric acid, 1 wt % of 5-aminotetrazole, 3 wt % of ammonium acetate, 5 wt % of acetic acid, 2 wt % of p-toluenesulfonic acid and water was prepared.

COMPARATIVE EXAMPLE 1

As shown in Table 1, 180 kg of a copper-titanium etchant that contains 10 wt % of ammonium persulfate, 0.5 wt % of ammonium bifluoride, 3 wt % of nitric acid, 1 wt % of 5-aminotetrazole and water was prepared.

TABLE 1

|  | APS (wt %) | ABF (wt %) | $HNO_3$ (wt %) | ATZ (wt %) | AA (wt %) | AcOH (wt %) | PTA (wt %) | water (wt %) |
|---|---|---|---|---|---|---|---|---|
| Example 1 | 10 | 0.5 | 3 | 1 | 3 | 5 | 2 | Residual amount |
| Comparative Example 1 | 10 | 0.5 | 3 | 1 | 0 | 0 | 0 | Residual amount |

APS: Ammonium persulfate
ATZ: 5-aminotetrazole
AcOH: Acetic acid
ABF: Ammonium bifluoride
AA: Ammonium acetate
PTA: p-toluenesulfonic acid

EXPERIMENTAL EXAMPLE 1

Evaluation of Etching Characteristics

A SiNx layer is deposited on a glass substrate by PECVD, a titanium layer having a thickness of 300 angstrom (Å) is laminated onto the SiNx layer, and a copper layer having a thickness of 15000 angstrom (Å) is laminated on the titanium layer. A photoresist was applied to the copper surface and patterned, and the substrate having the predetermined photoresist pattern on the copper layer was cut using a diamond blade to prepare samples of 550×650 mm.

The copper-titanium etchants of Example 1 and Comparative Example 1 were loaded into a spray type etching test apparatus, and heated to a temperature in excess of 25° C. Thereafter, when the etchant temperature reached 30±0.1° C., an etching process was performed to form wiring features. A total etching time was performed to achieve 40% of the standard for end-point detection ("EPD"). The sample was loaded, and the spray etching was performed. When the etching to open the wiring test features was completed, the sample was removed from the apparatus and then washed with deionized water and dried by using a hot forced-air drying device.

The residual photoresist was removed with a solvent-based photoresist stripper. After subsequent washing and drying, a scanning electron microscope ("SEM") was used to evaluate etching characteristics based on analysis of the profile and critical dimensions of the etched wiring features. The results are shown in Table 2.

EXPERIMENTAL EXAMPLE 2

Evaluation of Storage Characteristics

The copper-titanium etchants of Example 1 and Comparative Example 1 were prepared in a quantity sufficient to perform a reference etch, and the remaining etchant for each was stored at 25° C. for a scheduled storage test date of 5 days. After the scheduled date, an etching test was again performed using the aged etchants of Example 1 and Comparative Example 1 under the same conditions used for the reference etch. The results were then compared with the reference etch test results. The results are shown in Table 2.

EXPERIMENTAL EXAMPLE 3

Evaluation of Number of Processing Sheets

A reference etch was performed using the copper-titanium etchants of Example 1 and Comparative Example 1, and 4,000 ppm of copper powder was added and dissolved completely, to simulate the amount of copper present in the etchant after processing an arbitrary number of sheets. A second etch test was subsequently performed using the etchant containing the dissolved copper to approximate a useful lifetime of the etchant. Where the difference in the amount of lateral etching compared to that of reference test exceeded 0.2 μm, the etched sample was classified as being defective, indicative that the etchant had exceeded its useful lifetime for the number of sheets of copper-titanium clad substrates processable using the etchant (i.e., "processing sheets"). The results are shown in Table 2.

TABLE 2

|  | Etching characteristics | Storage characteristics | Number of processing sheets (difference in lateral etch between reference and second etch test) |
|---|---|---|---|
| Example 1 | CD Skew: ≤1 μm, Taper angle: 40 to 60 degrees | Etching profile: excellent | Difference in lateral etch Within 0.2 μm |
| Comparative Example 1 | CD Skew: ≤1 μm, Taper angle: 40 to 60 degrees | Etching profile: ≤good | Difference in lateral etch Exceeding 0.2 μm |

Referring to Table 2, the copper-titanium etchant according to Example 1 showed excellent etching characteristics including a critical dimension ("CD") Skew of ≤1 μm and a taper angle of 40 to 60 degrees of the sidewall relative to the plane of the substrate, and also excellent storage characteristics and number of processing sheets.

The copper-titanium etchant of Comparative Example 1 which contains no organic acid salt and p-toluenesulfonic acid also showed desirable etching characteristics including a CD Skew of ≤1 μm and a taper angle of 40 to 60 degrees comparable to that of Example 1, but exhibited poor storage characteristics and a low theoretical number of processing sheets relative to Example 1.

Copper Etchant

Subsequently, a copper etchant capable of selectively etching a copper or copper-containing metal in the metal wiring that is formed of a double layer having a titanium or titanium-containing metal layer and a copper or copper-containing metal layer formed on the titanium or titanium-containing metal layer will be described.

The copper etchant according to an Example of the present invention includes persulfate; at least one compound of an inorganic acid, an inorganic acid salt, or a mixture comprising at least one of the foregoing; a cyclic amine compound; at least one compound of an organic acid, an organic acid salt, or a mixture comprising at least one of the foregoing; p-toluenesulfonic acid; and water.

That is, the copper etchant according to the Example does not include a fluoride-containing compound, in contrast to the copper-titanium etchant. Including a fluoride-containing compound in the copper etchant would damage titanium or titanium-containing metal layer.

The persulfate is the primary oxidizing agent for etching the copper or copper-containing metal layer, and is included in an amount of 5 to 20 wt %, and preferably 7 to 18 wt %, based on the total weight of the copper etchant. The persulfate included in the copper etchant in this amount allows for the copper or copper-containing metal layer to be etched in an appropriate manner so that the etching profile is improved.

The persulfate may be selected from ammonium persulfate (APS), sodium persulfate (SPS), potassium persulfate (PPS) or a combination comprising at least one of the foregoing.

At least one compound of an inorganic acid, an inorganic acid salt, or a mixture comprising at least one of the foregoing oxidizes and etches the copper or copper-containing metal layer.

At least one compound of an inorganic acid, an inorganic acid salt, or a mixture comprising at least one of the foregoing is included in an amount of 1 to 10 wt %, and preferably 2 to 7 wt %, based on the total weight of the copper etchant. At least one compound of an inorganic acid, an inorganic acid salt, a mixture comprising at least one of the foregoing, included in the copper etchant in this amount allows the copper or copper-containing metal layer to be etched in an appropriate manner, and so that the etching profile is improved.

If the content of at least one compound of an inorganic acid, an inorganic acid salt, or a mixture comprising at least one of the foregoing is less than 1 wt %, the etching speed may deteriorate, generating etching profile defects and forming etching residues. If the content of at least one compound of an inorganic acid, an inorganic acid salt, or a mixture comprising at least one of the foregoing is equal to or more than 10 wt %, over-etching may occur, which can in turn cause cracks in the photoresist pattern adjacent to and defining the area being etched; etchant which penetrates the cracks may short or otherwise damage the wiring formed by the etching.

The inorganic acid may be selected from nitric acid, sulfuric acid, phosphoric acid, perchloric acid, or a combination comprising at least one of the foregoing, and the inorganic acid salt may be selected from nitrate, sulfate, phosphate, perchlorate, or a combination comprising at least one of the foregoing anions. The inorganic acid salt may include as a cation an alkali metal cation including a lithium, sodium, or potassium cation; an ammonium cation, an alkaline earth metal cation including magnesium or calcium cation; or a combination comprising at least one of the foregoing cations.

The cyclic amine compound, included in the etchant, controls the formation of a profile upon etching the copper or copper-containing metal layer. The cyclic amine compound is included in an amount of 0.3 to 5 wt %, and preferably 0.5 to 3 wt %, based on the total weight of the copper etchant. The cyclic amine compound, included in the copper etchant in this amount allows for a suitable copper etching rate and formation of a suitable taper angle for the sidewall of the etched wiring, and the amount of lateral etching can be controlled.

The cyclic amine compound is a $C_{2-20}$ triazole and may be selected from 5-aminotetrazole, tolytriazole, benzotriazole, methyltriazole, or a combination comprising at least one of the foregoing.

At least one compound of an organic acid, an organic acid salt, or a mixture comprising at least one of the foregoing further controls the taper angle of copper or copper-containing metal layer and the etching speed of the copper or copper-containing metal layer to maintain a predetermined etching profile for a desirable lateral etching.

At least one compound of an organic acid, an organic acid salt, a mixture comprising at least one of the foregoing is included in an amount of 1 to 10 wt %, and preferably 2 to 7 wt %, based on the total weight of the copper etchant.

If the content of at least one compound of an organic acid, an organic acid salt, or a mixture comprising at least one of the foregoing is less than 1 wt %, it is difficult to consistently maintain a predetermined etching profile. If the content of at least one compound of an organic acid, an organic acid salt, or a mixture comprising at least one of the foregoing is 10 wt % or more, over-etching may occur to increase the lateral etching.

The organic acid may be a $C_{1-20}$ carboxylic acid selected from acetic acid, glycolic acid, citric acid, oxalic acid, or a combination comprising at least one of the foregoing, and the organic acid salt may be selected from a potassium salt, a sodium salt an ammonium salt, or a combination comprising at least one of the foregoing of a compound selected from acetic acid, glycolic acid, citric acid, oxalic acid or a combination comprising at least one of the foregoing.

The inclusion of p-toluenesulfonic acid in the etchant as a stabilizer prevents changes in the etching characteristics due to secular changes occurring in the composition after preparation of the copper etchant, and allows for long term storage of the copper etchant by improving shelf-life, relative to comparable but unstabilized etchant compositions.

The p-toluenesulfonic acid is included in an amount of 0.1 to 5 wt %, and preferably 0.5 to 3 wt %, based on the total weight of the copper etchant.

If the content of p-toluenesulfonic acid is less than 0.1 wt %, changes in the etchant due to secular changes (i.e., degradation of the composition and loss of efficacy upon standing) may occur. If the content of p-toluenesulfonic acid is 3 wt % or more, the secular changes can be prevented, but over-etching due to the accompanying increased acidity may cause deterioration of the profile of the wiring.

Water is deionized water, and water used in semiconductor processing is used, and water of 18 milliohm per centimeter (MΩ/cm) or lower is preferred. Water is included with the etchant components in the copper etchant to fill up to provide the compositional balance of 100 wt %, based on the total weight of the copper etchant.

In addition to the aforementioned etchant components, the copper etchant may further include at least one ingredient selected from an etching adjustment agent, a surfactant, a chelating agent, a corrosion inhibitor, or a combination comprising at least one of the foregoing, where it will be understood that inclusion of such further ingredients will displace a corresponding weight percentage of water.

The copper etchant effectively and selectively etches a copper or copper-containing metal in the metal wiring, including a copper or copper-containing layer of a double layer having a titanium or titanium-containing metal layer and a copper or copper-containing metal layer formed on the titanium or titanium-containing metal layer. The copper etchant, prepared using components in the above components, does not damage the titanium or titanium-containing metal layer.

Hereinafter, performance of the copper etchant will be described with reference to specific Experimental Examples.

EXAMPLE 2

As shown in the following Table 3, 180 kg of a copper etchant that contains 12 wt % of ammonium persulfate, 3 wt % of nitric acid, 0.5 wt % of 5-aminotetrazole, 2 wt % of ammonium acetate, 5 wt % of acetic acid, 1 wt % of p-toluenesulfonic acid and water was prepared.

COMPARATIVE EXAMPLE 2

As shown in the following Table 3, 180 kg of a copper etchant that contains 10 wt % of ammonium persulfate, 3 wt % of nitric acid, 0.5 wt % of 5-aminotetrazole and water was prepared.

COMPARATIVE EXAMPLE 3

As shown in the following Table 3, 180 kg of a copper etchant that contains 12 wt % of ammonium persulfate, 3 wt % of nitric acid, 0.5 wt % of 5-aminotetrazole, 2 wt % of ammonium acetate, 5 wt % of acetic acid, 1 wt % of p-toluenesulfonic acid, 0.05 wt % of ammonium fluoride and water was prepared.

resist pattern on the copper layer was cut using a diamond blade to prepare samples of 550×650 mm.

The copper etchants of Example 2, Comparative Example 2 and Comparative Example 3 were loaded into a spray type etching test apparatus, and heated to a temperature in excess of 25° C. Thereafter, when the temperature reached 30±0.1° C., an etching process was performed to form wiring features. A total etching time was performed to achieve 40% of the standard for end-point detection (EPD). The sample was loaded, and the spray etching was performed. When the etching to open the wiring test features was completed, the sample was removed from the apparatus and then washed with deionized water and dried by using a hot forced-air drying device. The residual photoresist was removed with a solvent-based photoresist stripper. After subsequent washing and drying, a scanning electron microscope (SEM) was used to evaluate etching characteristics based on analysis of the profile and critical dimensions of the etched wiring features. The results are shown in Table 4.

EXPERIMENTAL EXAMPLE 5

Evaluation of Storage Characteristics

The copper etchants of Example 2 and Comparative Example 2 were prepared in a quantity sufficient to perform a reference etch, and the remaining etchant for each was stored at 25° C. for a scheduled storage test date of 5 days, and after the scheduled date, an etching test was again performed using the aged etchants of Example 2 and Comparative Example 2 under the same conditions used for the reference etch (carried out before storage of the etchant). The results were then compared with the reference etch test results. The results are shown in Table 4.

EXPERIMENTAL EXAMPLE 6

Evaluation of Number of Processing Sheets

A reference etch was performed using the copper etchants of Example 2 and Comparative Example 2, and 4,000 ppm of

TABLE 3

|  | APS (wt %) | $HNO_3$ (wt %) | ATZ (wt %) | AA (wt %) | AcOH (wt %) | PTA (wt %) | AF (wt %) | Water (wt %) |
| --- | --- | --- | --- | --- | --- | --- | --- | --- |
| Example 2 | 12 | 3 | 0.5 | 2 | 5 | 1 | 0 | Residual amount |
| Comparative Example 2 | 12 | 3 | 0.5 | 0 | 0 | 0 | 0 | Residual amount |
| Comparative Example 3 | 12 | 3 | 0.5 | 2 | 5 | 1 | 0.05 | Residual amount |

APS: Ammonium persulfate
AA: Ammonium acetate
PTA: p-toluenesulfonic acid
ATZ: 5-aminotetrazole
AcOH: Acetic acid
AF: Ammonium fluoride

EXPERIMENTAL EXAMPLE 4

Evaluation of Etching Characteristics

A SiNx layer is deposited on a glass substrate by PECVD, a titanium layer having a thickness of 300 angstrom (Å) is laminated onto the SiNx layer, and a copper layer having a thickness of 20000 angstrom (Å) is laminated on the titanium layer. A photoresist was applied to the copper surface and patterned, and the substrate having the predetermined photocopper powder was added and dissolved completely to simulate the amount of copper present in the etchant after processing an arbitrary number of sheets. A second etch test was subsequently performed using the etchant containing the dissolved copper to approximate a useful lifetime of the etchant, Where the difference in the amount of lateral etching compared to that of reference test exceeded 0.2 μm, the etched sample was classified as defective, indicative that the etchant had exceeded its useful lifetime for the number of sheets of copper-titanium clad substrates processable using the etchant (i.e., "processing sheets"). The results are shown in Table 4.

TABLE 4

| | Etching characteristics | Storage characteristics | Number of processing sheets (difference in lateral etch between reference and second etch test) |
|---|---|---|---|
| exemplary embodiment2 | CD Skew: ≤1 μm, Taper angle: 40 to 60 degrees | Etching profile: excellent | Difference in lateral etch Within 0.2 μm |
| Comparative Example2 | CD Skew: ≤1 μm, Taper angle: 40 to 60 degrees | Etching profile: ≤good | Difference in lateral etch Exceeding 0.2 μm |
| Comparative Example3 | lower layer (Ti) damage | — | — |

Referring to Table 4, the copper etchant according to Example 2 showed very excellent etching characteristics including a critical dimension (CD) Skew of ≤1 μm and taper angle of 40 to 60 degrees of the sidewall relative to the plane of the substrate, and also excellent storage characteristics and number of processing sheets.

Meanwhile, the copper etchant of Comparative Example 2 which contains no organic acid salt and p-toluenesulfonic acid also showed desirable etching characteristics including a CD Skew of ≤1 μm and a taper angle of 40 to 60 degrees comparable to that of Example 2, but exhibited poor storage characteristics and a low number of processing sheets relative to Example 2.

In addition, the copper etchant of Comparative Example 3 which is prepared by addition of ammonium fluoride to the copper etchant of Example 2 caused damage to the titanium layer.

The copper-titanium etchant and copper etchant according to the above Examples can be used in the fabrication of a memory semiconductor display panel as well as a flat panel display such as a liquid crystal display. In addition, these etchants can be used in the fabrication of other electronic devices such as those including metal wiring formed of a double layer having a titanium or titanium-containing metal layer and a copper or copper-containing metal layer formed on the titanium or titanium-containing metal layer.

Display Device

Hereinafter, a method of manufacturing a display device using the above described copper-titanium etchant and copper etchant according to the above Examples will be described.

Figure 2:
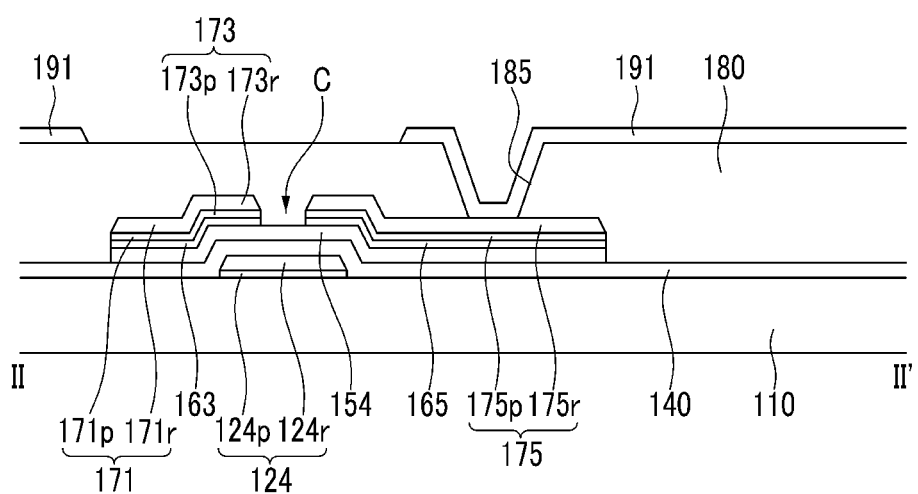
FIG. 2 is a cross-sectional view taken along line II-II' of FIG. 1.

FIG. 1 is a layout view of a thin film transistor array panel according to an exemplary embodiment, and FIG. 2 is a cross-sectional view taken along line II-II' of FIG. 1.

In the thin film transistor array panel of a display device according to an exemplary embodiment, a plurality of gate lines 121 (FIG. 1) including a gate electrode 124 (FIG. 2) are formed on a surface of a substrate 110 made of an insulating material such as glass or plastic, and (as seen in FIG. 2) a gate insulating layer 140, a plurality of semiconductor layers 154, a plurality of ohmic contacts 163 and 165, a plurality of data lines 171 and a plurality of drain electrodes 175 are sequentially formed thereon.

The gate line 121 transmits a gate signal and extends chiefly in a horizontal direction, and the gate electrode 124 protrudes to upside of the gate line 121.

As shown in FIG. 2, the gate line 121 includes a lower layer 124p made of titanium or titanium-containing metal and disposed on a surface of the substrate 110, and an upper layer 124r made of copper or copper-containing metal, and disposed on a surface of and in contact with the lower layer 124p. Herein, the upper layer 124r has a thickness of 10,000 to 50,000 Å and a lateral side of the upper layer 124r is inclined toward the substrate 110 at an angle of preferably 40 to 60 degrees.

The data line 171 transmits a data signal, and extends chiefly in a vertical direction to insulatedly cross the gate line 121. Each data line 171 includes a plurality of source electrodes 173 extending along the plane of the substrate 110 toward the gate electrode 124. The drain electrode 175 is separated from the data line 171 and faces the source electrode 173 in the plane of the substrate 110 with respect to the gate electrode 124, as shown in FIG. 2.

The data line 171, the source electrode 173 and the drain electrode 175 are composed of lower layers 171p, 173p, and 175p made of titanium or titanium-containing metal and disposed on a surface of semiconductor layer 154 and upper layers 171r, 173r, and 175r made of copper or copper-containing metal. Herein, the upper layers 171r, 173r, and 175r each have a thickness of 10,000 to 50,000 Å, and a lateral side of the upper layer 124r is inclined toward the substrate 110 and the angle is preferably 40 to 60 degrees.

The semiconductor layer 154 is positioned on the gate electrode 124 (with gate insulating layer 140 disposed between surfaces of these layers 154 and 124), and the ohmic contacts 163 and 165 disposed on a surface of semiconductor layer 154 are only disposed between surfaces of the semiconductor layer 154 and the data line 171 and the drain electrode 175 to reduce contact resistance therebetween.

A single gate electrode 124, and a single source electrode 173 and a single drain electrode 175 each vertically and insulatedly overlapping the single gate electrode 124 constitutes a single thin film transistor together with the semiconductor layer 154, and a channel C of the thin film transistor is formed in the semiconductor layer 154 between the source electrode 173 and the drain electrode 175.

A passivation layer 180, made of silicon nitride and/or silicon oxide, is formed on exposed surfaces of the data line 171 and the drain electrode 175.

A contact hole 185, exposing the drain electrode 175 (specifically, layer 175r), is formed in the passivation layer 180, and a pixel electrode 191, connected to the drain electrode 175 via the contact hole 185, is formed on a surface of the passivation layer 180.

Hereinafter, a method for manufacturing the thin film transistor array panel for a display device according to an exemplary embodiment will be described with reference to FIGS. 3 to 9 and FIG. 2.

FIG. 3 to FIG. 8 are cross-sectional views sequentially illustrating a method for manufacturing a thin film transistor array panel for a display device according to an exemplary embodiment.

Figure 3:
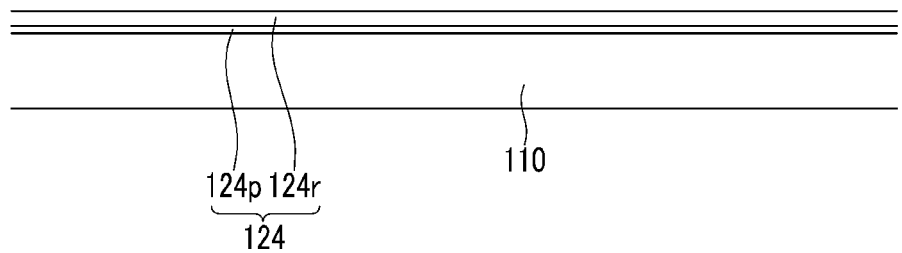
FIG. 3 to FIG. 8 are cross-sectional views sequentially illustrating a method for manufacturing a thin film transistor array panel for a display device according to an exemplary embodiment.

First, as shown in FIG. 3, the gate metal layer 120 having a lower gate metal layer 120p made of titanium or titanium-containing metal is formed on a surface of the transparent insulation substrate 110, and an upper gate metal layer 120r made of copper or copper-containing metal is formed on a surface of the lower gate metal layer 120p.

Figure 4:
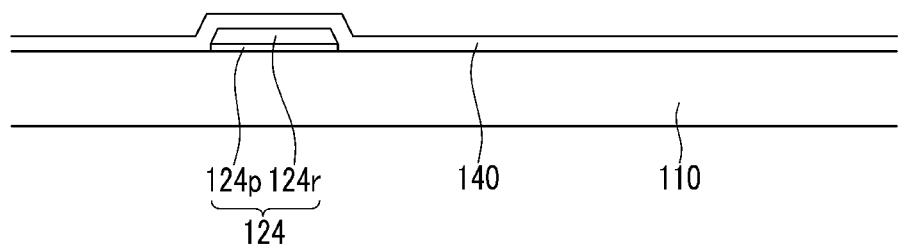

Subsequently, as shown in FIG. 4, the gate metal layer 120 is patterned using e.g., a photoresist pattern forming process, and etched using the copper-titanium etchant according to the above described exemplary embodiment so as to form the gate electrode 124, and the gate insulating layer 140 is formed on a surface of the insulation substrate 110 (corresponding to the front, i.e., viewing, side of the display prepared by this method) to cover the surface of 110 and the gate electrode 124.

The gate electrode 124 has a lower layer 124p made of titanium or titanium-containing metal and an upper layer 124r made of copper or copper-containing metal. Herein, the upper layer 124r has a thickness of 10,000 to 50,000 Å, and a lateral side of the upper layer 124r is inclined toward the substrate 110, at an angle of preferably 40 to 60 degrees.

Figure 5:
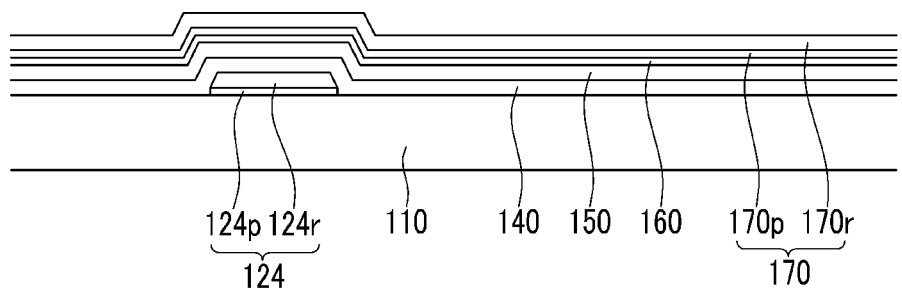

Subsequently, as shown in FIG. 5, an amorphous silicon layer 150 is deposited on a surface of the gate insulating layer 140, an amorphous silicon layer 160 doped with impurities (e.g., p-type dopants such as boron, aluminum, etc. or n-type dopants such as phosphorus, arsenic, antimony, etc.) is deposited on a surface of the amorphous silicon layer 150, and a data metal layer 170 is deposited on a surface of the doped amorphous silicon layer 160. Herein, the data metal layer 170 has a lower data metal layer 170p made of titanium or titanium-containing metal and deposited on the surface of the doped amorphous silicon layer 160, and an upper data metal layer 170r made of copper or copper-containing metal and deposited on a surface of the lower data metal layer 170p.

Figure 6:
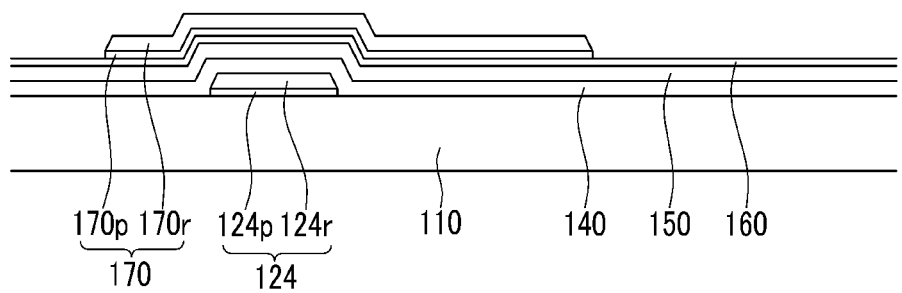
Figure 7:
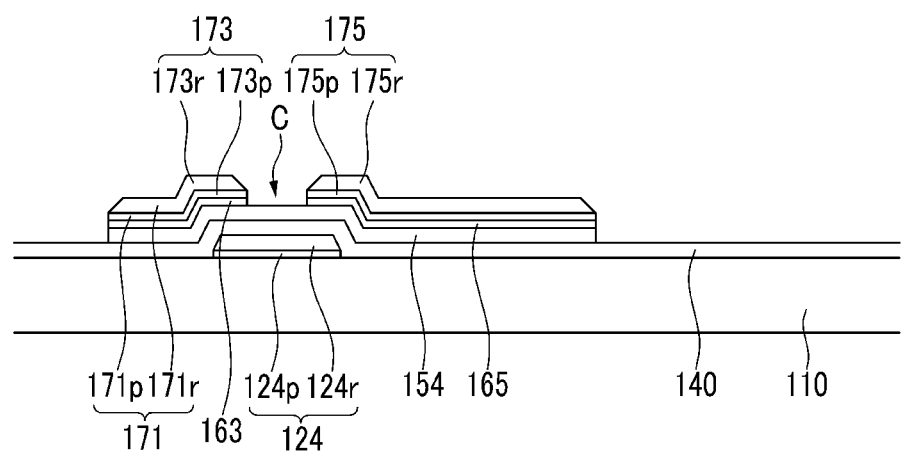

Subsequently, as shown in FIG. 6 and FIG. 7, the data metal layer 170 is patterned using e.g., a photoresist pattern forming process, and etched using the copper-titanium etchant according to the above described exemplary embodiment (FIG. 6), and the amorphous silicon layer 150 and the amorphous silicon layer 160 doped with impurities are etched to form a data line 171 including a source electrode 173, a drain electrode 175, ohmic contact layers 163 and 165 and a semiconductor layer 154, where the source electrode 173 and drain electrode 175 are formed by exposing after etch a portion of the surface of semiconductor layer 154 to form channel C (FIG. 7).

The data line 171, the source electrode 173 and the drain electrode 175 include, respectively, lower layers 171p, 173p, and 175p made of titanium or titanium-containing metal, and upper layers 171r, 173r, and 175r made of copper or copper-containing metal. Herein, the upper layers 171r, 173r, and 175r have a thickness of 10,000 to 50,000 Å, and the lateral sides of the upper layers 171r, 173r, and 175r are inclined toward the side of the substrate 110, at an angle of preferably 40 to 60 degrees.

Figure 8:
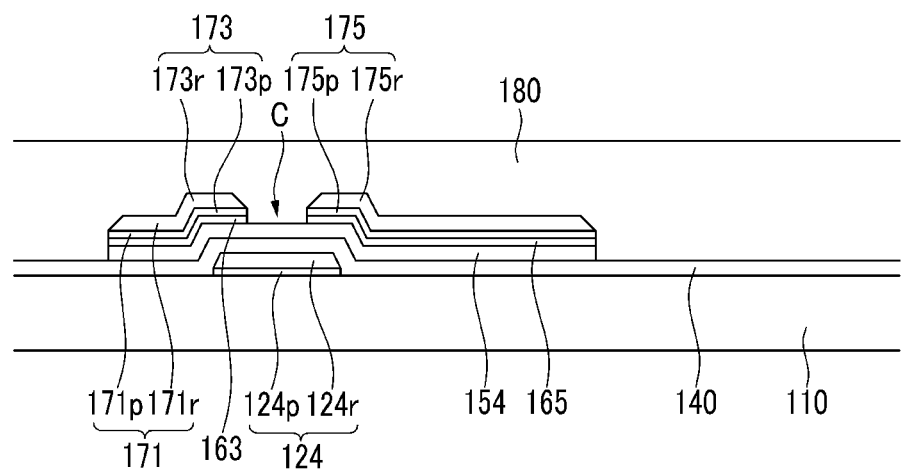

Subsequently, as shown in FIG. 8, a passivation layer 180 is formed on the surface (i.e., front side) including the data line 171, the drain electrode 175 and the gate insulating layer 140, and then, as shown in FIG. 2, a contact hole 185 exposing the drain electrode 175 is formed in the passivation layer 180 over drain electrode 175 to expose a portion of the surface of upper layer 175r of the drain electrode 175, and a pixel electrode 191 is formed on a surface of the passivation layer 180 including the interior of contact hole 185 to contact the upper layer 175r of drain electrode 175.

Figure 9:
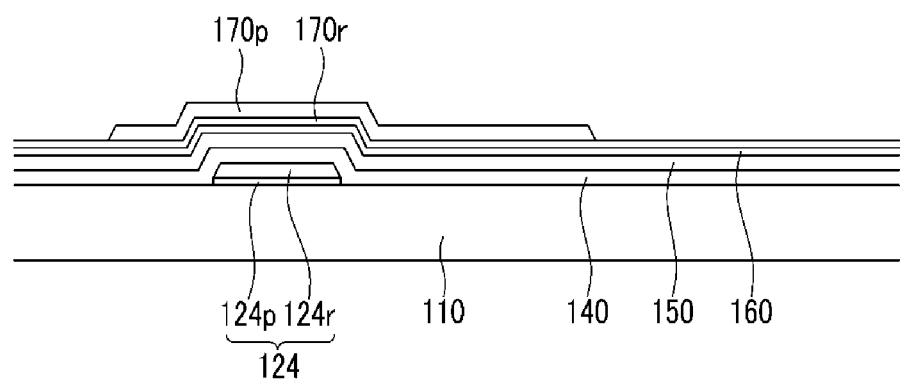
FIG. 9 is a cross-sectional view illustrating a part of a manufacturing method of a thin film transistor array panel for a display device according to an exemplary embodiment.

In addition, as shown in FIG. 9, the upper data metal layer 170r and the lower data metal layer 170p are not etched at the same time, but the upper data metal layer 170r may be etched first, and then the lower data metal layer 170p may be etched second. Where it is desirable to do so, the upper data metal layer 170r is etched using the copper etchant according to the above described exemplary embodiment without damaging to the lower data metal layer 170p.

Subsequently, as shown in FIG. 7, the data line 171 including the source electrode 173, the drain electrode 175, the ohmic contact layers 163 and 165 and the semiconductor layer 154 are formed.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. In the present exemplary embodiment, a liquid crystal display is exemplified, but the present invention may be applied to a variety of other display devices including a thin film transistor.

What is claimed is:

1. An etchant, comprising:
7 to 18 wt % of persulfate,
1 to 10 wt % of at least one compound of an inorganic acid, an inorganic acid salt, or a mixture comprising at least one of the foregoing,
0.3 to 5 wt % of a cyclic amine compound,
1 to 10 wt % of at least one compound of an organic acid, an organic acid salt, or a mixture comprising at least one of the foregoing,
0.1 to 5 wt % of p-toluenesulfonic acid, and water,
based on the total weight of the etchant.

2. The etchant of claim 1, wherein the persulfate is selected from ammonium persulfate, sodium persulfate, potassium persulfate, or a combination comprising at least one of the foregoing.

3. The etchant of claim 2, wherein the inorganic acid is selected from nitric acid, sulfuric acid, phosphoric acid, perchloric acid, or a combination comprising at least one of the foregoing, and the inorganic acid salt is selected from nitrate, sulfate, phosphate, perchlorate, or a combination comprising at least one of the foregoing.

4. The etchant of claim 3, wherein the cyclic amine compound is selected from 5-aminotetrazole, tolyltriazole, benzotriazole, methyltriazole, or a combination comprising at least one of the foregoing.

5. The etchant of claim 4, wherein the organic acid is selected from acetic acid, glycolic acid, citric acid, oxalic acid, or a combination comprising at least one of the foregoing, and the organic acid salt is selected from a potassium salt, a sodium salt, an ammonium salt, or a combination comprising at least one of the foregoing of a compound selected from acetic acid, glycolic acid, citric acid, oxalic acid, or a combination comprising at least one of the foregoing.

6. The etchant of claim 5, further comprising 0.01 to 2 wt % of a fluoride-containing compound, based on the total weight of the etchant.

7. The etchant of claim 6, wherein the fluoride-containing compound is selected from ammonium fluoride, sodium fluoride, potassium fluoride, ammonium bifluoride, sodium bifluoride, potassium bifluoride, or a combination comprising at least one of the foregoing.

8. The etchant of claim 1, further comprising 0.01 to 2 wt % of a fluoride-containing compound, based on the total weight of the etchant.

9. The etchant of claim 8, wherein the fluoride-containing compound is selected from ammonium fluoride, sodium fluoride, potassium fluoride, ammonium bifluoride, sodium bifluoride, potassium bifluoride, or a combination comprising at least one of the foregoing.

\* \* \* \* \*

UNITED STATES PATENT AND TRADEMARK OFFICE
CERTIFICATE OF CORRECTION

PATENT NO. : 8,785,935 B2  Page 1 of 1
APPLICATION NO. : 13/168408
DATED : July 22, 2014
INVENTOR(S) : Hong-Sick Park et al.

It is certified that error appears in the above-identified patent and that said Letters Patent is hereby corrected as shown below:

Title Page, Item (73), Assignee, delete "Samsung Display Co., Ltd. (KR)" and insert therefor
-- Samsung Display Co., Ltd. (KR); DONGWOO FINE-CHEM CO., LTD. (KR) --

Signed and Sealed this
Fourteenth Day of April, 2015

Michelle K. Lee
*Director of the United States Patent and Trademark Office*